(12) United States Patent
Stowe et al.

(10) Patent No.: US 9,658,350 B2
(45) Date of Patent: May 23, 2017

(54) RECHARGEABLE SOLID STATE NEUTRON DETECTOR AND VISIBLE RADIATION INDICATOR

(71) Applicants: Ashley C. Stowe, Knoxville, TN (US); Brenden Wiggins, Oak Ridge, TN (US); Arnold Burger, Nashville, TN (US)

(72) Inventors: Ashley C. Stowe, Knoxville, TN (US); Brenden Wiggins, Oak Ridge, TN (US); Arnold Burger, Nashville, TN (US)

(73) Assignees: CONSOLIDATED NUCLEAR SECURITY, LLC, Oak Ridge, TN (US); FISK UNIVERSITY, Nashville, TN (US)

( * ) Notice: Subject to any disclaimer, the term of this patent is extended or adjusted under 35 U.S.C. 154(b) by 0 days.

(21) Appl. No.: 14/729,715

(22) Filed: Jun. 3, 2015

(65) Prior Publication Data
US 2015/0285924 A1    Oct. 8, 2015

Related U.S. Application Data

(63) Continuation-in-part of application No. 13/658,591, filed on Oct. 23, 2012.

(51) Int. Cl.
*G01T 3/00* (2006.01)
*C30B 33/02* (2006.01)
(Continued)

(52) U.S. Cl.
CPC ............... *G01T 3/00* (2013.01); *C30B 11/12* (2013.01); *C30B 29/46* (2013.01); *C30B 33/02* (2013.01); *H01L 21/67098* (2013.01)

(58) Field of Classification Search
CPC .. G01T 3/00; C30B 33/02; C30B 29/46; H01L 21/67098
See application file for complete search history.

(56) References Cited

U.S. PATENT DOCUMENTS 4,534,822 A    8/1985 Sashital
7,687,780 B2    3/2010 Bell et al.
(Continued)

OTHER PUBLICATIONS

O. Balachninaite, L. Petraviciute, M. Maciulevicius, V. Sirutkaitis, L. Isaenko, S. Lobanov, A. Yelisseyev, J.-J. Zondy; Absorptance and scattering losses measurements of the mid-infrared nonlinear crystals LiInSe2 and LiInS2 in the IR range.; ISSN 1392-2114 Ultragarsas Nr.3(60). 2006.
(Continued)

*Primary Examiner* — David Porta
*Assistant Examiner* — Faye Boosalis
(74) *Attorney, Agent, or Firm* — Clements Bernard Walker PLLC; Christopher L. Bernard; Lawrence A. Baratta, Jr.

(57) ABSTRACT

A radiation detection device, including: a support structure; and a chalcopyrite crystal coupled to the support structure; wherein, when the chalcopyrite crystal is exposed to radiation, a visible spectrum of the chalcopyrite crystal changes from an initial color to a modified color. The visible spectrum of the chalcopyrite crystal is changed back from the modified color to the initial color by annealing the chalcopyrite crystal at an elevated temperature below a melting point of the chalcopyrite crystal over time. The chalcopyrite crystal is optionally a $^6$LiInSe$_2$ crystal. The radiation is comprised of neutrons that decrease the $^6$Li concentration of the chalcopyrite crystal via a $^6$Li(n,α) reaction. The initial color is yellow and the modified color is one of orange and red. The annealing temperature is between about 450

(Continued)

degrees C. and about 650 degrees C. and the annealing time is between about 12 hrs and about 36 hrs.

22 Claims, 4 Drawing Sheets

(51) Int. Cl.
    *C30B 29/46*     (2006.01)
    *H01L 21/67*     (2006.01)
    *C30B 11/12*     (2006.01)

(56) References Cited

U.S. PATENT DOCUMENTS

2003/0052701 A1*   3/2003   Brown ................ G01T 1/2018
                                                            250/370.11
2012/0153178 A1*   6/2012   Kanatzidis ............ H01L 31/085
                                                            250/370.12
2013/0020488 A1*   1/2013   Flamanc ............... G01T 1/2018
                                                             250/362

OTHER PUBLICATIONS

L. Isaenko, A. Yelisseyev, S. Lobanov, A. Titov, V. Petrov, J.-J. Zondy, P. Krinitsin, A. Merkulov, V. Vedenyapin, J. Smironova; "Growth and properties of LiGaX2 (X-S, Se, Te) single crystals for nonlinear optical applications in the mid-IR"; Crys. Res. Technol. 38, No. 3-5, 379-387 (2003) / DO1 10.1002/crat.200310047.; 2003 Wiley-VCH Verlag GmbH & Co. KGaA, Wenheim 0232-1300/03/3-504-0379.

L. Isaenko, P. Krinitsin, V. Vedenyapin, A. Yelisseyev, A. Merkulov, J.-J. Xondy, and V. Petrov; "LiGaTe2: A New Highly Nonlinear Chalcopyrite Optical Crystal for the Mid-IR"; Crystal Growth & Design, vol. 5. No. 4 1325-1329, 2005.

* cited by examiner

RECHARGEABLE SOLID STATE NEUTRON DETECTOR AND VISIBLE RADIATION INDICATOR

CROSS-REFERENCE TO RELATED APPLICATION

The present patent application/patent is a continuation-in-part (CIP) of co-pending U.S. patent application Ser. No. 13/658,591, filed on Oct. 23, 2012, and entitled "METHODS FOR SYNTHESIZING SEMICONDUCTOR QUALITY CHALCOPYRITE CRYSTALS FOR NONLINEAR OPTICAL AND RADIATION DETECTION APPLICATIONS AND THE LIKE," the contents of which are incorporated in full by reference herein.

STATEMENT REGARDING FEDERALLY SPONSORED RESEARCH OR DEVELOPMENT

The U.S. Government has rights to the present disclosure pursuant to Contract No. DE-NA0001942 between the U.S. Department of Energy and Consolidated Nuclear Security, LLC.

FIELD OF THE DISCLOSURE

The present disclosure relates generally to a rechargeable solid state neutron detector and visible radiation indicator. More specifically, the present disclosure relates to a rechargeable solid state neutron detector and visible radiation indicator utilizing a chalcopyrite crystal or the like.

BACKGROUND OF THE DISCLOSURE

Radiation detectors have been developed with great excitement for many years. Such radiation detectors are comprised of numerous materials in gas, liquid, and solid state that operate either by generation of electrical charge or photons. While gas and liquid state radiation detectors can be refilled after some level of consumption (i.e., interaction with radiation), no solid state radiation detectors have been developed that can be recharged with an active element or isotope after some level of consumption. This is particularly relevant to neutron detection media, in which the nuclear reaction results in a transformation of the active isotope into another state. Table I shows common thermal neutron (0.025 eV) reactions with various active isotopes of interest.

TABLE I

Thermal Neutron Absorption Reactions, Q values and Cross Sections.

| Isotope | Reaction | Q value (M eV) | $\sigma_{th\ (barns)}$ |
|---|---|---|---|
| $^3$He | $_2^3$He + $_0^1$n → $_1^3$H + $_1^1$p | 0.764 | 5330 |
| $^6$Li | $_3^6$Li + $_0^1$n → $_1^3$H + $_2^4\alpha$ | 4.780 | 940 |
| $^{10}$B | $_5^{10}$B + $_0^1$n → $_3^7$Li + $_2^4\alpha$ | 2.310 (94%)<br>2.792 (6%) | 3840 |
| $^{157}$Gd | $_{64}^{157}$Gd + $_0^1$n → $_{64}^{158}$Gd + γ<br>conversion electrons (70-182 keV) | 8.0 | 25900 |

Clearly, for the light elements, the reaction transforms the active element into another element, such that over time the detection medium is consumed. It would thus be useful to recharge the active element component of the radiation detector rather than replace the entire device.

Further, while there are passive neutron indicators, such as Thermal Luminescence Detectors (TLDs), that absorb neutrons and are analyzed after some prescribed period of time to determine the energy or amount of effective neutron dose observed, these detectors require processing after the radiation exposure. A simple visual indicator of the presence of or even a range of colors indicating increasing levels of a dose would be of significant utility as a static primary indicator.

In various exemplary embodiments, the present disclosure provides such a rechargeable, solid state, graduated, static primary indicator.

BRIEF SUMMARY OF THE DISCLOSURE

The chalcopyrite class of ternary semiconductor compounds has previously been proven useful as both nonlinear optical crystals and radiation detectors, in general. In various embodiments of the present disclosure, this class of materials is utilized as a simple visible radiation indicator. Neutrons impinging on the $^6$Li in the crystal undergo a $^6$Li(n, α) reaction, which transforms the $^6$Li atom into a charged particle and tritium. As such, the presence of neutrons reduces the $^6$Li concentration in the crystal proportional to the neutron flux. For $^6$LiInSe$_2$, it has been shown that reducing the Li concentration results in a visible color change from an original yellow to orange, and with sufficient reducing to red. The crystal can therefore be used without any other components to indicate the presence of neutron radiation through this color change.

Further, the color change is reversible. The neutron detection crystal can be recharged with $^6$Li through a $^6$Li annealing process that transforms the orange/red crystal back to yellow. This recharging can be completed for the indicator crystal described above, or for crystals of the chalcopyrite type being used in more complex detector architypes, which operate by semiconductor and scintillation mechanisms.

In one exemplary embodiment, the present disclosure provides a radiation detection device, including: a support structure; and a chalcopyrite crystal coupled to the support structure; wherein, when the chalcopyrite crystal is exposed to radiation, a visible spectrum of the chalcopyrite crystal changes from an initial color to a modified color. The visible spectrum of the chalcopyrite crystal is changed back from the modified color to the initial color by annealing the chalcopyrite crystal at an elevated temperature below a melting point of the chalcopyrite crystal over time. The chalcopyrite crystal is optionally a $^6$LiInSe$_2$ crystal. The radiation is comprised of neutrons that decrease the $^6$Li concentration of the chalcopyrite crystal via a $^6$Li(n,α) reaction. The initial color is yellow and the modified color is a shade of orange or red. The annealing temperature is between about 450 degrees C. and about 650 degrees C. and the annealing time is between about 12 hrs and about 36 hrs.

In another exemplary embodiment, the present disclosure provides a radiation detection method, including: providing a support structure; and coupling a chalcopyrite crystal to the support structure; wherein, when the chalcopyrite crystal is exposed to radiation, a visible spectrum of the chalcopyrite crystal changes from an initial color to a modified color. The visible spectrum of the chalcopyrite crystal is changed back from the modified color to the initial color by annealing the chalcopyrite crystal at an elevated temperature below a melting point of the chalcopyrite crystal over time. The chalcopyrite crystal is optionally a $^6$LiInSe$_2$ crystal. The radiation is comprised of neutrons that decrease the $^6$Li concentration of the chalcopyrite crystal via a $^6$Li(n,α) reaction. The initial color is yellow and the modified color is a shade of orange or red. The annealing temperature is between about 450 degrees C. and about 650 degrees C. and the annealing time is between about 12 hrs and about 36 hrs.

BRIEF DESCRIPTION OF THE DRAWINGS

The present disclosure is illustrated and described herein with reference to the various drawings, in which like reference numbers are used to denote like device components/method steps, as appropriate, and in which.

DETAILED DESCRIPTION OF THE DISCLOSURE

Figure 1:
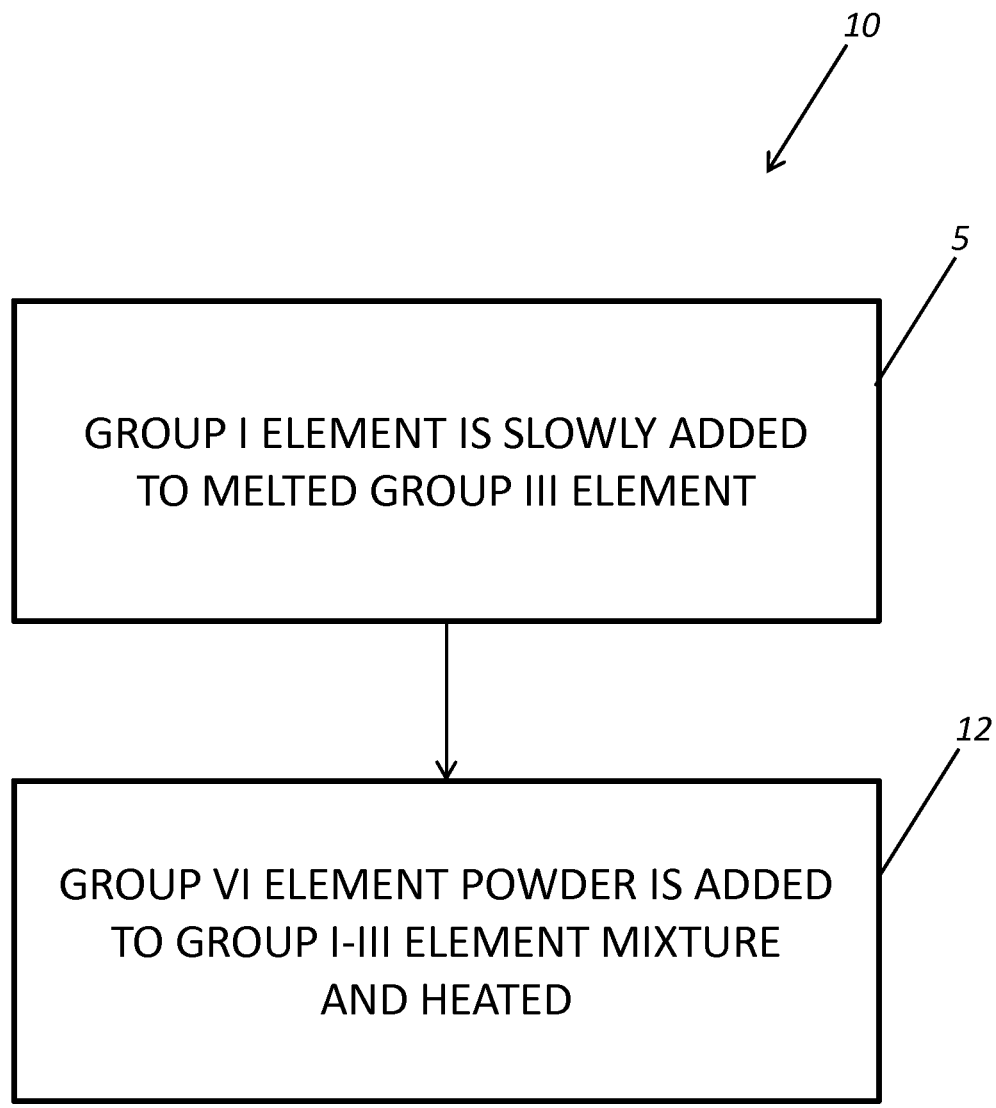
FIG. 1 is a flowchart illustrating one exemplary embodiment of the method for synthesizing I-III-VI$_2$ compounds of the present disclosure, specifically utilizing a heating process.

By way of background, related to U.S. Pat. No. 7,687,780 (Bell et al.), the detecting element includes a compound having the composition I-III-VI$_2$ or II-IV-V$_2$, where the "I" component is from column 1A or 1B of the periodic table, the "II" component is from column 2B of the periodic table, the "III" component is from column 3A of the periodic table, the "IV" component is from column 4A of the periodic table, the "V" component is from column 5A of the periodic table, and the "VI" component is from column 6A of the periodic table. A more concise manner of description is that the crystal is formed from elements in the group of 1A-3A-6A, 1B-3A-6A, or 2B-4A-5A of the periodic table. An example from group 1A-3A-6A is lithium-gallium-selenium. An example from group 1B-3A-6A is copper-gallium-selenium. An example from group 2B-4A-5A is cadmium-germanium-antimony. Crystals formed from groups 1B-3A-6A and 2B-4A-5A are chalcopyrites. The detecting element detects ionizing electromagnetic radiation by generating a signal proportional to the energy deposited in the element, and detects neutrons by virtue of the ionizing electromagnetic radiation emitted by one or more constituent materials subsequent to capture. The detector may contain more than one neutron sensitive element.

The detecting system generally includes a semiconductor crystal onto which conducting electrodes are deposited on opposing surfaces of the crystal. The semiconductor material may be intrinsic material or doped to produce intrinsic material. Intrinsic material, when referring to semiconductors, refers to a semiconductor material in which the majority and minority charge carriers in the material are balanced and the material does not display either negative (n-) or positive (p-) type conductivity. Doping is the process of introducing small amounts of impurities (typically in the amount of parts per million (ppm)) for the purpose of altering the electrical properties of the material to force a desired density of positive and negative charge carriers. The electrical contacts may be ohmic, or may be Schottky. An ohmic contact is a metal semiconductor contact with very low resistance independent of the polarity of the applied voltage. A Schottky contact is a metal semiconductor contact used to form a potential barrier. The resulting detecting element forms a p-n, or p-i-n diode, or simply a bulk semiconducting material.

In a preferred embodiment, a voltage is applied between the electrodes by a suitable means, such as a battery. A resistor is provided in line between one of the electrodes and the battery. Any signal generated in response to radiation is extracted through a junction between the crystal and the resistor. If the detecting element is simply bulk semiconducting material, then the polarity of the voltage with respect to the resistor is of no consequence. Although the resistor connected between the negative terminal of the battery and the crystal is contemplated, the resistor may also be connected between the positive terminal of the battery and the crystal with the signal taken from the junction between the resistor and the crystal. If the crystal is realized as a diode (p-n, p-i-n, or Schottky), then the connection must be such that the diode is reverse biased by the battery.

When the crystal is exposed to ionizing electromagnetic radiation, electron-hole pairs are created in the bulk of the material. These charges are separated by the applied voltage and the resulting charge pulse is sensed as a current pulse or a voltage pulse. The amplitude of the charge pulse is proportional to the energy deposited in the crystal by the radiation. In this mode, the crystal realizes a detector of alpha, beta, gamma, and x-ray radiation, in addition to cosmic rays.

In one arrangement, the crystal may be fabricated with one element that reacts with neutrons and subsequently emits ionizing electromagnetic radiation. The crystal then also serves to detect neutrons. For example, if the "I" element is silver (Ag), an element from column 1B of the periodic table, then exposure to neutrons results in transmutation of the silver nuclei to radioisotopes with short half-lives. These isotopes decay by the emission of beta particles (electrons), which create ionization in the detector just as would radiation originating outside the detecting element. Analysis of the spectrum of pulse amplitudes and the temporal behavior of the count rate yields a signature of the presence of neutrons.

In another arrangement, if the "I" element is lithium, an element from column 1A of the periodic table, then exposure to neutrons results in the exothermic reaction $^6$Li(n,$\alpha$)$^3$H. The energetic triton and alpha particles liberate charge as they decelerate, ultimately depositing their entire energy in the crystal. Analysis of the resulting spectrum of pulse amplitudes yields a signature of the presence of neutrons.

In a further arrangement, if the "III" (3A) element of the crystal is indium (In), behavior similar to that described for silver is observed. In a still further arrangement, more than one element may be neutron sensitive. For example, if both silver and indium are used, then multiple half-lives are observed in the count rate, and spectra of beta particles characteristic of both elements are observed in the pulse height spectrum. Analysis of such data can give information on the spectral characteristics of the incident neutron flux.

In operation, the semiconductor radiation detecting apparatus works in the following manner. Means are provided to convert current or charge pulses to a digital value. The electrical charge signal generated in response to radiation passes from the junction through a capacitor to a charge integrating pre-amplifier whose output signal, in turn, is directed to a shaping amplifier. The shaping amplifier produces an approximately Gaussian shaped pulse. The pulse is directed to an analog-to-digital converter (ADC), which translates the analog voltage developed by the shaping amplifier into a digital value. The digital values from the converter are directed to a processor and display. The processor records the number of times each value occurs during a measurement. This accumulates a histogram of the magnitudes of the pulses produced by the incident radiation. The processor compares these values to known values and provides an indication of the incident radiation based on the comparison. The use of the amplifiers, converter, and processor to condition signals and create an indication of the incident radiation is well known to those of ordinary skill in the art and does not require detailed explanation.

In an alternate embodiment, the pre-amplifier simply provides gain without integration and the shaping amplifier is replaced by a voltage comparator and gated integrator. The voltage comparator triggers the gated integrator to integrate the voltage pulse from the pre-amplifier. The gated integrator signals the ADC to perform a conversion when the integration period is complete. The processor and display perform the same functions as described above.

In another alternate embodiment, a battery supplies bias to the crystal. The charge generated by incident radiation in the crystal is separated by the potential developed by the virtual ground at the inverting terminal of the operational amplifier, and the resulting current pulse is forced through a feedback resistor. In this manner, the current pulse is converted to a voltage pulse and is then directed to the pre-amplifier.

These crystals are useful as radiation detectors, and as semiconductors, for the following reasons. Carrier mobility in the range of 500-10,000 cm$^2$/V-s has been reported and band gaps between 1.2 and 3.13 eV have been produced. These values are comparable to or better than those of germanium and indicate that performance at room temperature should exceed that of CZT. In addition, some of the constituent materials have high neutron absorption cross sections, conferring simultaneous sensitivity to ionizing electromagnetic radiation and neutrons.

There are a number of advantages to using chalcopyrites. There is a ready availability of high purity, oriented, crack free, single chalcopyrite crystals produced for use in optical applications. These crystals are used in infrared nonlinear optical equipment to effect second harmonic generation or optical parametric oscillation. The finished materials have improved properties that should continue to improve as a result of research and development spurred by the interest of the military in using chalcopyrites in high powered lasers. Chalcopyrites have physical properties that permit their use as semiconductor radiation detectors at room temperature. As such, they operate according to the same physics as do silicon, CZT, and mercuric iodide. However, they differ from these materials in that their average atomic number is much larger than silicon, making them useful at higher energies than silicon. They can be grown in large, crack free single crystal boules (unlike CZT and mercuric iodide). Further, the neutron absorber density is large and average Z number is low compared to CZT, for example, such that high neutron detection efficiencies can be realized using thin crystals, thereby minimizing gamma interference in the chalcopyrite crystals. They also are an improvement over mercuric iodide in that the use of mercuric iodide is limited to applications in which the temperature does not exceed 80 degrees Celsius, while chalcopyrites can withstand temperatures up to several hundred degrees Celsius.

Without limitation, it may be advantageous to deposit more than two electrodes onto the crystal to control the shape of the internal electric field. In another example, sandwiching the crystal between spring loaded contacts enables the application of a voltage without the deposition of electrodes. In yet another example, the pre-amplifier, shaping amplifier, and ADC may be replaced by a charge-to-digital converter.

Figure 2:
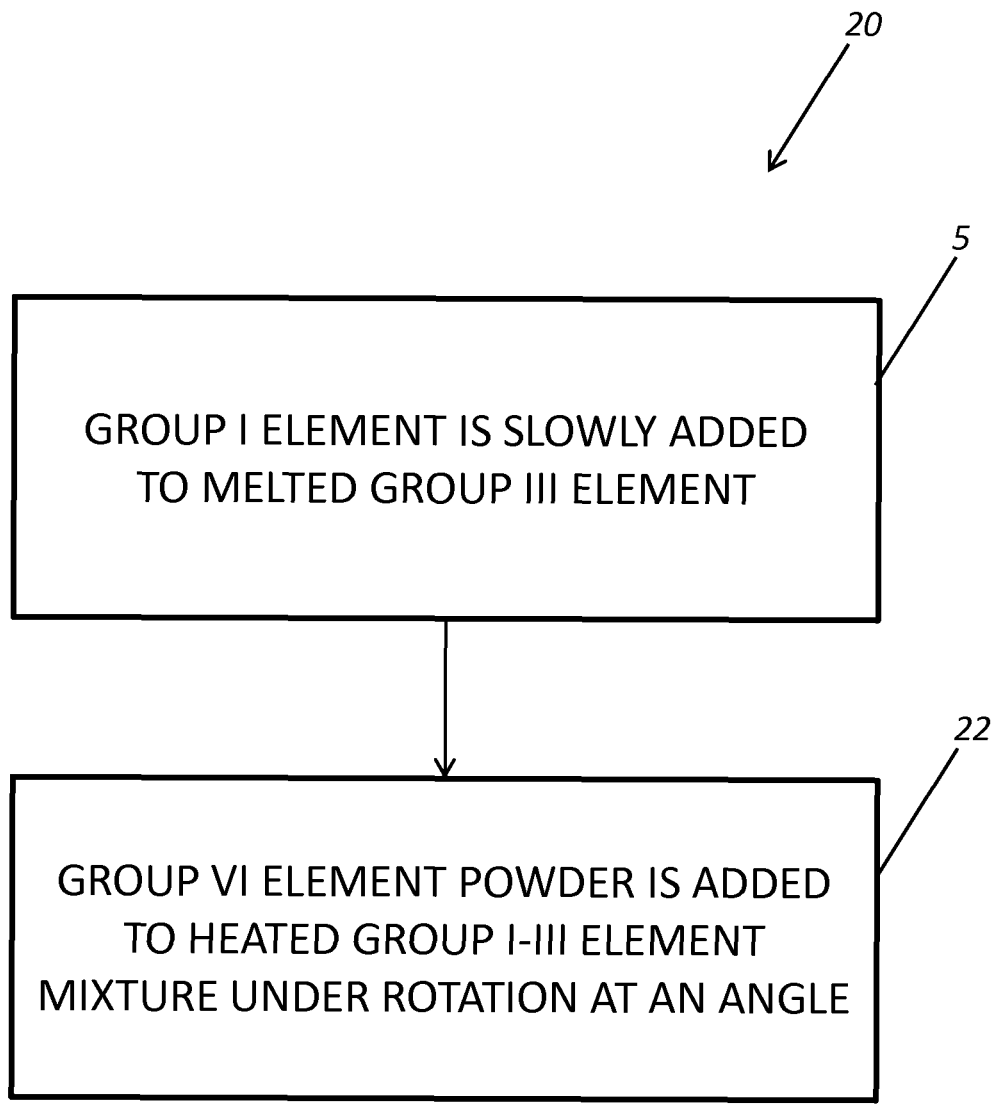
FIG. 2 is a flowchart illustrating another exemplary embodiment of the method for synthesizing I-III-VI$_2$ compounds of the present disclosure, specifically utilizing a mixing process.
Figure 3:
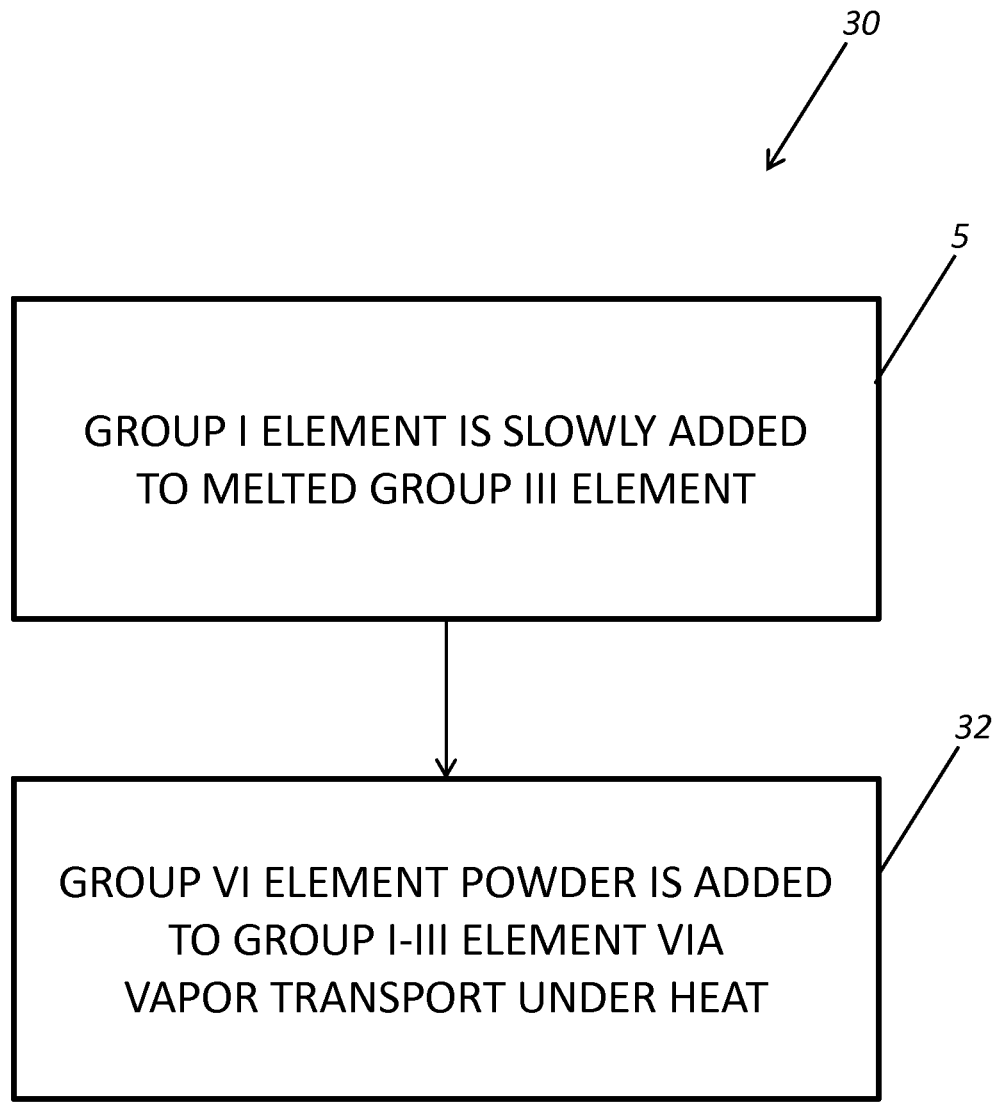
FIG. 3 is a flowchart illustrating a further exemplary embodiment of the method for synthesizing I-III-VI$_2$ compounds of the present disclosure, specifically utilizing a vapor transport process.

In view of the above, the present disclosure involves separating I-III-VI$_2$ synthesis from the constituent elements into two distinct steps, and three associated embodiments are contemplated. The highest quality elemental starting materials are required to achieve successful synthesis of I-III-VI$_2$ compounds. Group I elements typically have the lowest purities as starting materials. Referring to FIGS. 1-3, in all exemplary embodiments, the most reactive element (Group I) is reacted with the Group III element, forming a binary alloy with equal stoichiometry 5. Optionally, the Group III element is melted in a crucible under inert atmosphere for increased safety and purity. The Group I element is then slowly added to the melt, allowing the small amount of Group I element to react before another addition. This process minimizes overheating of the reaction, which causes additional alloy stoichiometries to form in the melt. The result is a highly crystalline, single phase I-III material. Two moles of a Group VI element are then added to the I-III compound at elevated temperature to form the chalcopyrite I-III-VI$_2$. The method by which the Group VI element is added is different in each of the three exemplary embodiments.

Referring specifically to FIG. 1, in the first exemplary embodiment 10, the Group VI elemental powder is added directly to the I-III alloy and heated to about 700-900 degrees C. (depending on the group VI element) in a crucible 12. The reaction is allowed to proceed to completion and then cooled. Because the I-III compound is formed in an initial reaction step, the stoichiometry is defined as one mole for each element. Addition of the Group VI element for the final I-III-VI reaction has lower overall stoichiometric variability throughout the charge.

Referring specifically to FIG. 2, in the second exemplary embodiment 20, the addition of the Group VI element into a single crucible is as with the first exemplary embodiment; however, the constituents are mixed at elevated temperature with constant crucible rotation at an angle 22, for example about 20 degrees. Rotation further promotes mixing during the synthesis to reduce phase variability.

Referring specifically to FIG. 3, the third exemplary embodiment 30 involves vapor transport of the Group VI element 32. The previously prepared I-III compound is placed in one well of a crucible, while the Group VI element is placed in an adjacent well. As the mixture is heated to about 700-900 degrees C., the Group VI element slowly vaporizes and is transported through thermal currents to the melted group I-III well. The reaction then occurs to form I-III-VI$_2$. Vapor transport further slows the reaction to minimize overheating and promote a single phase synthetic charge.

It should be noted that the methods of the present disclosure are not limited to the synthesis of semiconductor materials. Doping with an activator (e.g., Group IV element) may be performed to create a scintillator material, for example.

Thus, the chalcopyrite class of compounds of general composition $^6$Li-III-VI$_2$ are bulk semiconductor compounds that are readily synthesized and prepared as pure, large single crystals. In particular, the stoichiometry $^6$LiInSe$_2$ has been shown to respond to neutrons (with particular efficiency to thermal neutrons) through the $^6$Li(n, α) reaction. This reaction produces a significant number of electron-hole pairs within the semiconductor crystal, which are then measured as an induced current. Further, the crystal can be configured such that the same reaction produces visible photons, which can be measured in a proportional manner via a coupled photodetector, such as a photomultiplier tube (PMT). It has also been shown that the crystal comes in two forms, which are both considered to have bulky purity. The crystal is manifested as both a red crystal and as a yellow crystal. It has been confirmed that the color is mediated by slight changes in the lithium concentration in the crystal. As such, the crystal can be used as a neutron indicator. If the crystal is prepared in its yellow form (i.e., ideal $^6$Li concentration), the crystal will darken under neutron exposure. The $^6$Li(n, α) reaction consumes $^6$Li in the crystal, thereby reducing the overall lithium concentration and causing a color change. The color change is, in fact a continuum of color from yellow through orange to a deep red color.

Figure 4:
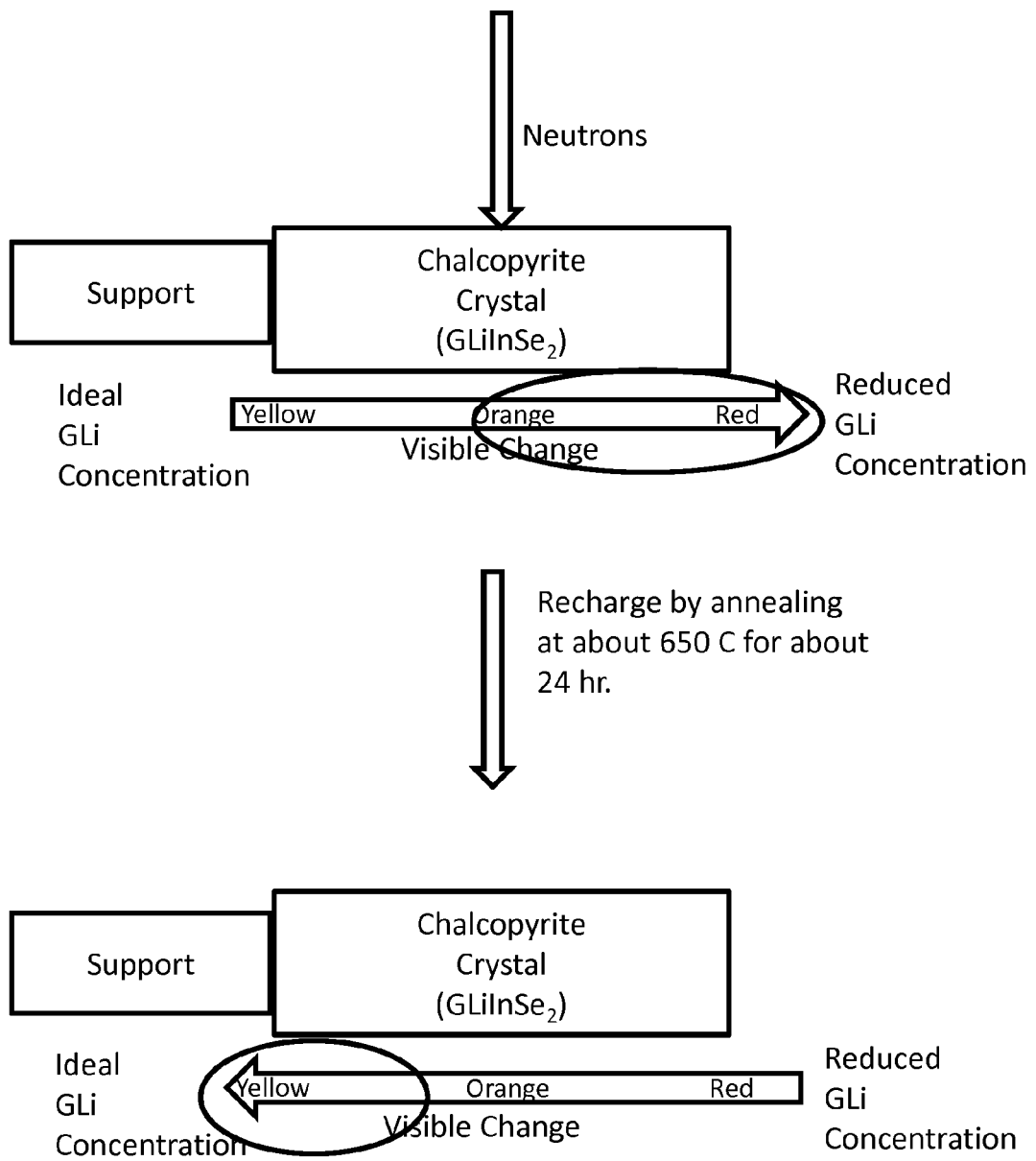
FIG. 4 is a schematic diagram illustrating one exemplary embodiment of the radiation detection device of the present disclosure, highlighting its visible indicator functionality and rechargeable solid state nature.

Of further utility is the fact that the $^6$Li content in the crystal can be restored via an annealing process. If the depleted crystal (orange to red crystal form) is exposed to $^6$Li metal at elevated temperature below the LiInSe$_2$ melting point (typically about 650 C for about 24 hrs, the Li concentration within the bulk of the crystal returns to stoichiometry and the color is again yellow. The annealing temperature is generally between about 450 degrees C. and about 650 degrees C. and the annealing time is between about 12 hrs and about 36 hrs. As such, the chalcopyrite (either as an instrumented detector or as a simple indicator) is rechargeable. This functionality is illustrated schematically in FIG. 4.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A passive radiation detection device, comprising:
   a support structure; and
   a chalcopyrite crystal coupled to the support structure;
   wherein, when the chalcopyrite crystal coupled to the support structure is subsequently exposed to radiation, a visible spectrum of the chalcopyrite crystal coupled to the support structure changes from an initial color to a modified color.

2. The radiation detection device of claim 1, wherein the visible spectrum of the chalcopyrite crystal is changed back from the modified color to the initial color by annealing the chalcopyrite crystal at an elevated temperature below the melting point of the chalcopyrite crystal over time.

3. The radiation detection device of claim 2, wherein the annealing temperature is between about 450 degrees C. and about 650 degrees C. and the annealing time is between about 12 hrs and about 36 hrs.

4. The radiation detection device of claim 1, wherein the chalcopyrite crystal comprises a $^6$LiInSe$_2$ crystal.

5. The radiation detection device of claim 4, wherein neutrons in the radiation decrease the $^6$Li concentration of the chalcopyrite crystal via a $^6$Li(n,α) reaction.

6. The radiation detection device of claim 4, wherein the initial color is yellow and the modified color is one of orange and red.

7. A passive radiation detection method, comprising:
   providing a support structure; and
   coupling a chalcopyrite crystal to the support structure;
   wherein, when the chalcopyrite crystal coupled to the support structure is subsequently exposed to radiation, a visible spectrum of the chalcopyrite crystal coupled to the support structure changes from an initial color to a modified color.

8. The radiation detection method of claim 7, wherein the visible spectrum of the chalcopyrite crystal is configured to be changed back from the modified color to the initial color by annealing the chalcopyrite crystal at an elevated temperature below the melting point of the chalcopyrite crystal over time.

9. The radiation detection method of claim 8, wherein the annealing temperature is between about 450 degrees C. and about 650 degrees C. and the annealing time is between about 12 hrs and about 36 hrs.

10. The radiation detection method of claim 7, wherein the chalcopyrite crystal comprises a $^6$LiInSe$_2$ crystal.

11. The radiation detection method of claim 10 wherein neutrons in the radiation decrease the $^6$Li concentration of the chalcopyrite crystal via a $^6$Li(n,α) reaction.

12. The radiation detection method of claim 10, wherein the initial color is yellow and the modified color is one of orange and red.

13. A method for using a passive radiation detection device, comprising:
   providing a support structure;
   providing a chalcopyrite crystal coupled to the support structure;
   subsequently exposing the chalcopyrite crystal coupled to the support structure to radiation such that a visible spectrum of the chalcopyrite crystal coupled to the support structure changes from an initial color to a modified color; and
   changing the visible spectrum of the chalcopyrite crystal back from the modified color to the initial color by annealing the chalcopyrite crystal at an elevated temperature below a melting point of the chalcopyrite crystal over time.

14. The method of claim 13, wherein the chalcopyrite crystal comprises a $^6$LiInSe$_2$ crystal.

15. The method of claim 14, wherein neutrons in the radiation decrease the $^6$Li concentration of the chalcopyrite crystal via a $^6$Li(n,α) reaction.

16. The method of claim 14, wherein the initial color is yellow and the modified color is one of orange and red.

17. The method of claim 13, wherein the annealing temperature is between about 450 degrees C. and about 650 degrees C. and the annealing time is between about 12 hrs and about 36 hrs.

18. A method for recharging a passive radiation detection device comprising a chalcopyrite crystal coupled to a support structure that has subsequently been exposed to radiation such that a visible spectrum of the chalcopyrite crystal coupled to the support structure has changed from an initial color to a modified color, the method comprising:
   changing the visible spectrum of the chalcopyrite crystal back from the modified color to the initial color by annealing the chalcopyrite crystal at an elevated temperature below a melting point of the chalcopyrite crystal over time.

19. The method of claim 18, wherein the chalcopyrite crystal comprises a $^6$LiInSe$_2$ crystal.

20. The method of claim 19, wherein neutrons in the radiation decrease the $^6$Li concentration of the chalcopyrite crystal via a $^6$Li(n,α) reaction.

21. The method of claim 19, wherein the initial color is yellow and the modified color is one of orange and red.

22. The method of claim 18, wherein the annealing temperature is between about 450 degrees C. and about 650 degrees C. and the annealing time is between about 12 hrs and about 36 hrs.

* * * * *